United States Patent [19]
Denner et al.

[11] Patent Number: 5,432,371
[45] Date of Patent: Jul. 11, 1995

[54] MONOLITHICALLY INTEGRATED CIRCUIT

[75] Inventors: Volkmar Denner, Pfullingen; Wolfgang Troelenberg, Reutlingen; Peter Brauchle, Nehren; William-Neil Fox, Gomaringen; Neil Davies, Kusterdingen, all of Germany

[73] Assignee: Robert Bosch GmbH, Stuttgart, Germany

[21] Appl. No.: 167,839

[22] PCT Filed: Jun. 10, 1992

[86] PCT No.: PCT/DE92/00479

§ 371 Date: Dec. 20, 1993

§ 102(e) Date: Dec. 20, 1993

[87] PCT Pub. No.: WO93/00709

PCT Pub. Date: Jan. 7, 1993

[30] Foreign Application Priority Data

Jun. 20, 1991 [DE] Germany .................. 41 20 394.1

[51] Int. Cl.6 .................................. H01L 27/02
[52] U.S. Cl. .................................. 257/409; 257/355; 257/360; 257/401
[58] Field of Search ............... 257/355, 360, 401, 409; 253/355, 360, 401, 409

[56] References Cited

U.S. PATENT DOCUMENTS

| | | | |
|---|---|---|---|
| 4,313,768 | 2/1982 | Sanders et al. | 257/409 |
| 5,235,201 | 8/1993 | Honna | 257/355 |

Primary Examiner—Jerome Jackson
Assistant Examiner—Nathan Kip Kelley
Attorney, Agent, or Firm—Kenyon & Kenyon

[57] ABSTRACT

A monolithically integrated circuit arrangement is arranged in a disc-shaped monocrystalline semiconductor body (100) of a first conductivity type, which semiconductor body consists of silicon and has a first and second main surface. The monolithically integrated circuit arrangement contains a vertical MOSFET power transistor (T1) which consists of a plurality of partial transistors connected in parallel and surrounded by a guard ring (4) of a second conductivity type opposite that of the semiconductor body (100). Proceeding from the first main surface (13), at least one zone (7, 8) of the conductivity type of the semiconductor body (100) but of increased impurity concentration is diffused into the guard ring (4) so as to form at least one active and/or passive peripheral circuit element (T2) which has a protective and/or regulating and/or control function.

15 Claims, 5 Drawing Sheets

MONOLITHICALLY INTEGRATED CIRCUIT

BACKGROUND OF THE INVENTION

The present invention relates to a monolithically integrated circuit arrangement.

MOSFET power transistors which consist of a plurality of partial transistors (cells) which are connected in parallel and which are arranged in a single monocrystalline semiconductor body consisting of silicon are known All partial transistors can be surrounded by a diffusion zone which is arranged as a guard ring around the cell arrangement of the MOSFET power transistor.

On the other hand, protective circuits are known which serve as a protection for the MOSFET power transistor. In particular, protective circuits provide protection of such transistors against short circuits and overvoltages. The active and/or passive circuit elements assuming said protective function are connected externally as a discrete component to the MOSFET power transistor.

SUMMARY OF THE INVENTION

The monolithically integrated circuit arrangement containing a MOSFET power transistor has the advantage that active and/or passive circuit elements which have protective and/or regulating and/or control functions are monolithically integrated as peripheral circuit elements with the MOSFET power transistor in a single monocrystalline semiconductor body.

In accordance with the present invention, a monolithically integrated circuit arrangement is arranged in a disc-shaped monocrystalline semiconductor body of a first conductivity type. The semiconductor body includes silicon and has a first and second main surface. The monolithically integrated circuit arrangement contains a vertical MOSFET power transistor which includes a plurality of partial transistors connected in parallel and surrounded by a guard ring of a second conductivity type opposite that of the semiconductor body.

Proceeding from the first main surface, at least one zone of the conductivity type of the semiconductor body but of an increased impurity concentration is diffused into the guard ring to form at least one active and/or passive peripheral circuit element which has a protective, regulating, and/or control function.

DETAILED DESCRIPTION

Figure 1:
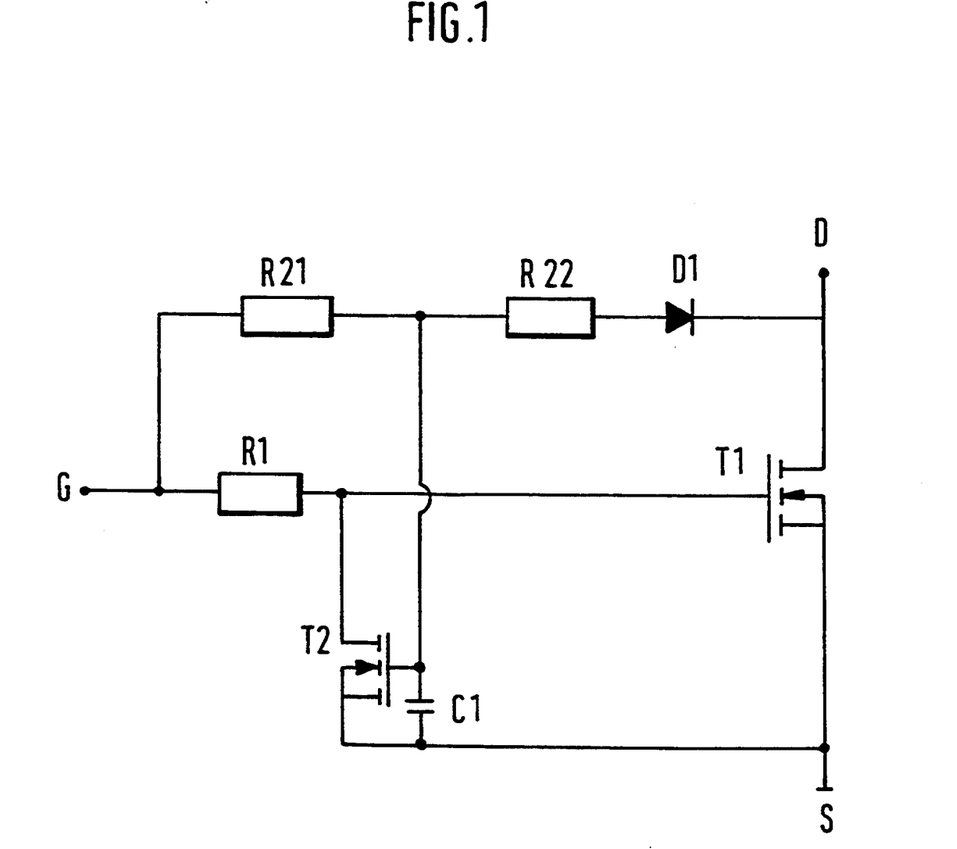
FIG. 1 shows in a circuit diagram a MOSFET power transistor having a protective circuit which disconnects the MOSFET power transistor in the case of an overload or short circuit.

In the circuit diagram shown in FIG. 1, T1 is a n-channel MOSFET power transistor consisting of a plurality of partial transistors connected in parallel, S is its source terminal and D its drain terminal. The input terminal G of the MOSFET power transistor T1 is connected by a first ohmic resistor R1 to its polysilicon gate.

An n-channel MOSFET auxiliary transistor T2 is connected with its source electrode to the source electrode of the MOSFET power transistor T1. The drain electrode of the MOSFET auxiliary transistor T2 is connected to the polysilicon gate of the MOSFET power transistor T1. The polysilicon gate of the MOSFET auxiliary transistor T2 is connected on the one hand via a second ohmic resistor R21 to the input terminal G and on the other hand, via the series connection of a third ohmic resistor R22 and a protective diode D1, to the drain terminal D of the MOSFET power transistor T1. Furthermore, the polysilicon gate of the MOSFET auxiliary transistor T2 is connected to the one foil of a capacitor C1, the other foil of which being connected to the source electrode of the MOSFET auxiliary transistor T2.

The manner of operation of the circuit arrangement according to FIG. 1 is as follows:

In the OFF state, the voltage UGS=0 is present between the input terminal G and the source terminal S. Operating voltage is present between the drain terminal D and the source terminal S. Since the diode D1 is polarized in reverse direction, the polysilicon gate of the MOSFET auxiliary transistor T2 and the capacitor C1 are discharged. The gate source voltage of the MOSFET auxiliary transistor T2 is UGS2=0.

When the arrangement is turned on, i.e. UGS is increased typically to +5 volt, the gate capacitor of the MOSFET power transistor T1 is charged and the gate source voltage of the MOSFET power transistor T1 (UGS1) thus increases. At the same time the gate of the MOSFET auxiliary transistor T2 and the capacitor C1 are charged by the resistor R21. UGS2 thus also increases. If UGS2 increases above the threshold voltage of the MOSFET auxiliary transistor T2, then the connecting process of the MOSFET power transistor T1 is interrupted and the circuit can then not be turned on. Therefore, the time constant for the increase in UGS2 must be selected larger than that for the MOSFET power transistor T1. Under this condition, the following connection process results: UGS1 increases above the threshold voltage of the MOSFET power transistor T1 and a current I flows via said transistor. The voltage UDS results in this state as UDS=RDS(on)I. If this value is small enough, a current starts to flow from the gate of the MOSFET auxiliary transistor T2 via the resistor R21 and the diode D1 to the drain terminal D and the charging process of the gate of the MOSFET auxiliary transistor T2 is discontinued. The MOSFET auxiliary transistor T2 is thus not connected and the entire circuit is in the ON state.

In the normal ON state, a voltage UGS2 just below the threshold voltage of the MOSFET auxiliary transistor T2 is adjusted by the current path G-R21-R22-D1-D. If the current I now increases in the MOSFET power transistor T1, then the voltage drop at the RDS(on) increases and thus the potential of the drain terminal D. As a result hereof the voltage UGS2 increases. Upon the exceeding of the threshold voltage of the MOSFET auxiliary transistor T2, the auxiliary transistor T2 is connected and the voltage UGS1 is thus lowered. The RDS(on) of the MOSFET power transistor T1 thereby increases and UDS increases. The effect is thereby reinforced and UGS2 increases further. This leads to the complete disconnecting of the MOSFET power transistor T1. Reconnecting is only possible if the external voltage UGS is lowered in order to discharge the gate capacitor of the MOSFET auxiliary transistor T2 and the capacitor C1. In this way, the normal OFF state is again reached.

Figure 2:
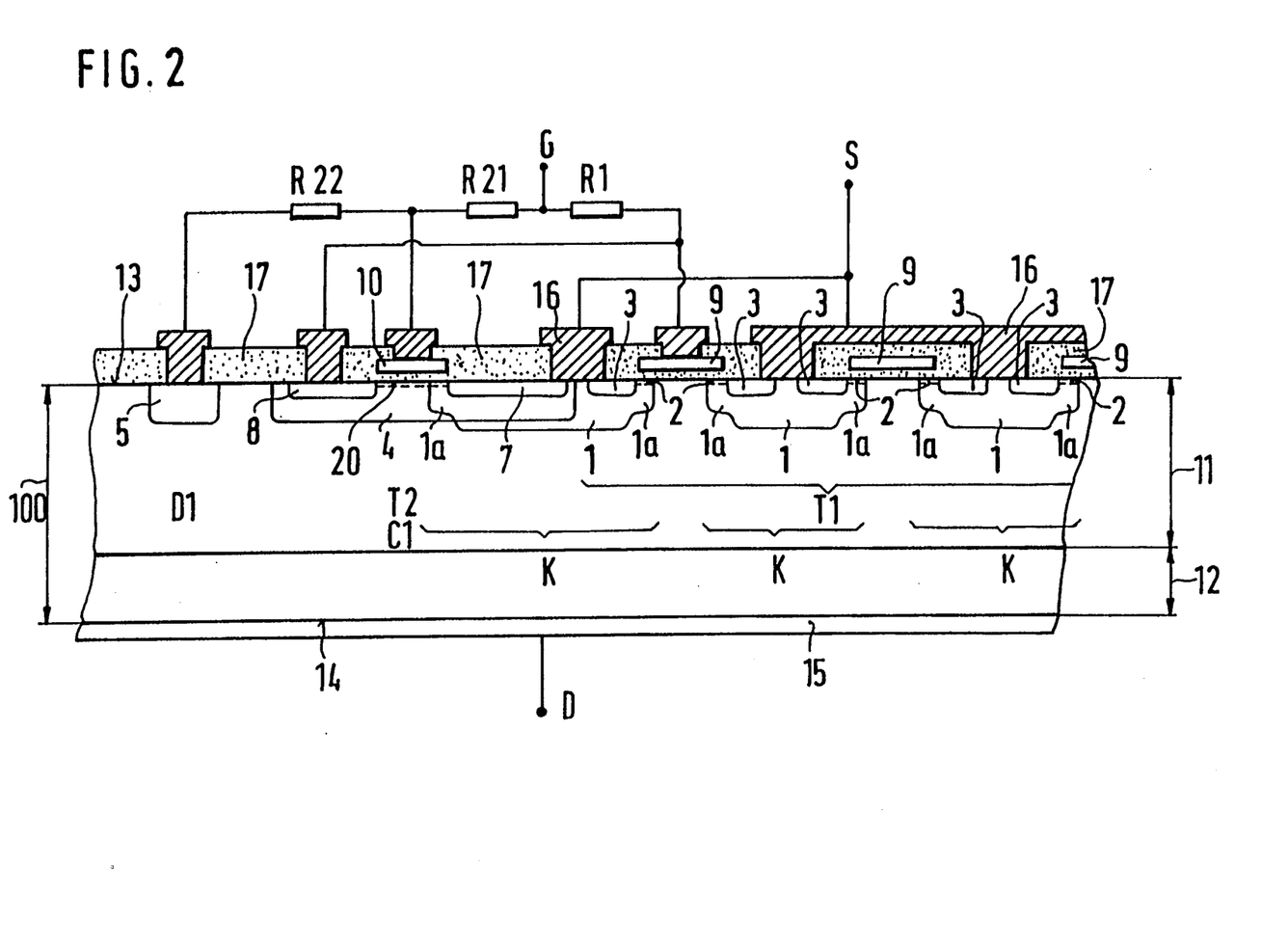
FIG. 2 is a section through a disc-shaped monocrystalline semiconductor body of silicon which contains the circuit arrangement of FIG. 1 in monolithically integrated form according to a first embodiment of the invention, shown partially broken away.

FIG. 2 shows a section through the monolithically integrated circuit arrangement of FIG. 1. A disc-shaped semiconductor body 100 consisting of monocrystalline silicon contains an n⁻-conductive epitaxial layer 11 which is applied to a lower n+ conductive substrate 12 consisting of monocrystalline silicon. The semiconductor body 100 consisting of the substrate 12 and the epitaxial layer 11 thus has on its top side a first main surface 13 and on its bottom side a second main surface 14. To the second main surface 14 of the semiconductor body 100 there has been applied a metallization 15 which forms the drain terminal D of the vertical MOSFET power transistor T1.

The right part of the section of FIG. 2 shows the known structure of the MOSFET power transistor T1 which is sub-divided into cells in which the density of the cells can be up to 2.1 million cells per square inch. The central and left part shows the edge region in which the peripheral circuit elements are arranged.

The cells of the MOSFET power transistor T1 contain p⁻-doped body zones K which are in each case formed by the diffusing into each other of a p+-doped small-area zone 1 and a p⁻-doped large-area zone 1a. The small-area zone 1 has in this case in each case a higher depth of penetration than the large-area zone 1a. Into the p-doped body zone K formed in this manner, n++-doped source zones 3 are in each case diffused in such a manner within the highly doped central region that the edge region 1a of low doping of the body zones K remains free and extends up to the first main surface 13 of the semiconductor body 100. In this edge region of the body zones K, the conductivity channel 2 in each cell of the MOSFET power transistor T1 is formed in the manner that this edge region has in each case opposite it a part 9 of the polysilicon gate of said transistor T1. The parts 9 of the polysilicon gate of the MOSFET power transistor T1 serve as mask upon the production of the diffusion zones 1, 1a and 3 and they are therefore connected to each other within the cell arrangement of the MOSFET power transistor T1 in lattice-like manner and thus electrically conductive. Within each cell of the MOSFET power transistor T1, the source zones 3 are in each case short-circuited to the body zones K by means of a joint metallization 16 which extends for the formation of said short circuit in the central region of each body zone K up to the first main surface 13 of the semiconductor body 100 and grips around the individual parts 9 of the polysilicon gate with the interposing of the silicon dioxide layer 17. This joint metallization 16 forms the source electrode S of the MOSFET power transistor T1.

An annular trough 4 serving as guard ring is diffused in around the entire cell field of the MOSFET power transistor T1, said trough forming the edge structure of the MOSFET power transistor T1 in order to receive the blocking voltage between the electrodes S and D. The annular trough 4 is p-conductive. Its doping concentration is between the doping concentration of the highly doped central region 1 and the doping concentration of the weakly doped edge region 1a of the body zone K. The same applies by analogy to the depth of penetration of the annular trough 4. It is between the depths of penetration of the two above-mentioned regions 1 and 1a of the body zones K.

FIG. 2 shows the annular trough 4 in a region where it is strongly widened with respect to the other regions of the trough. This widened region of the trough 4 serves to receive the lateral n-channel MOSFET auxiliary transistor T2. It is formed by the strongly n-doped zones 7 as source and 8 as drain and by the polysilicon layer 10 as gate. The n++-doped zones 7 and 8 are in this connection produced with the same diffusion process as the source zones 3 of the MOSFET power transistor T1. As can be noted from FIG. 2, the guard ring 4 overlaps in its widened region, which forms the body zone of the MOSFET auxiliary transistor T2, with the body zone K of the adjoining outermost cell of the MOSFET power transistor T1 in such a manner that its source zone 7 is completely embedded in the said body zone K and that its drain zone 8 is arranged in the region outside said body zone K. The overlapping is in this case furthermore developed in such a manner that the weakly doped edge region 1a of said body zone K of the MOSFET power transistor T1 extends up into the channel region of the MOSFET auxiliary transistor T2. As a result of this, the threshold voltage of the MOSFET auxiliary transistor T2 is determined by the two regions 4 and 1a and by the epitaxial layer 11 and it is thus higher than the threshold voltage of the MOSFET power transistor T1 which is only determined by the diffusion region 1a and the epitaxial layer 11.

Simultaneously with the guard ring 4, another p-conductive zone 5 is diffused into the monocrystalline semiconductor body 100, the pn-junction of said zone 5 forming, together with the epitaxial layer 11, the protective diode D1 of FIG. 1.

Figure 3:
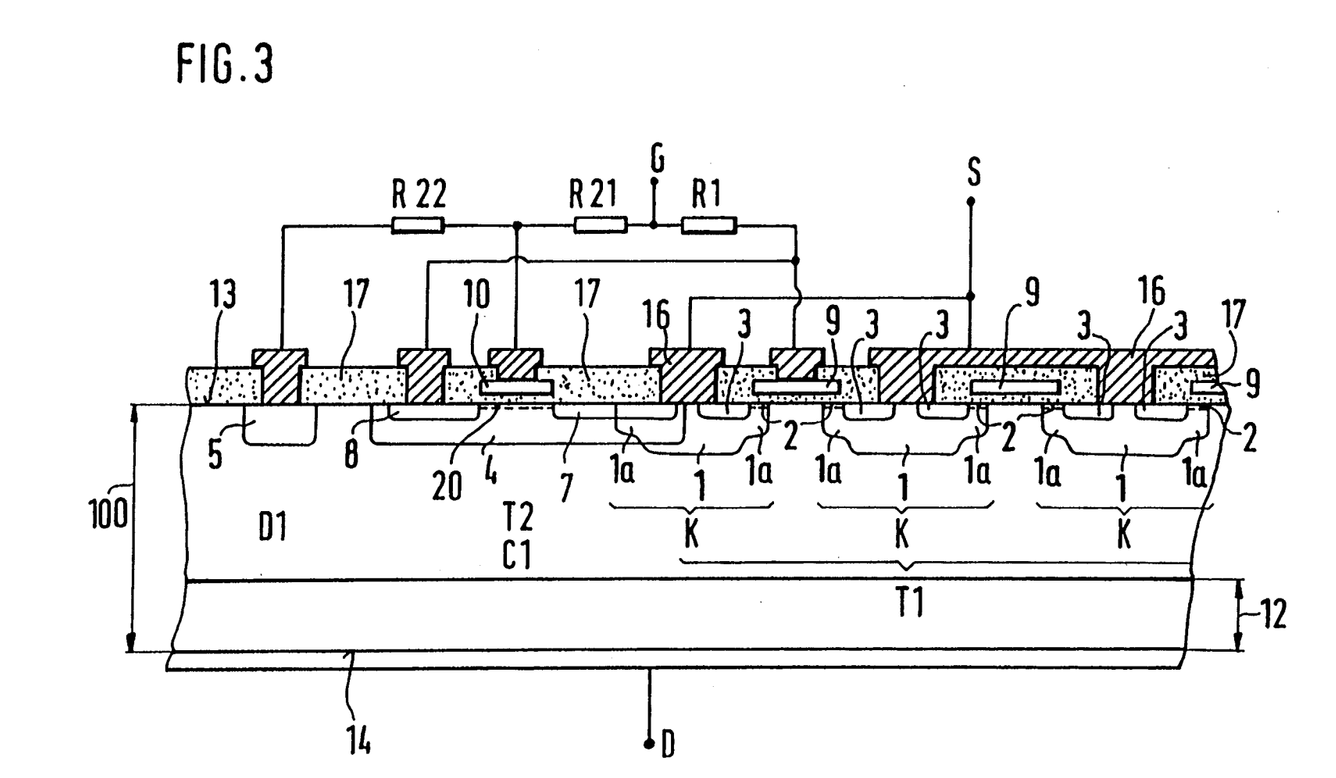
FIG. 3 shows a second embodiment of a monolithically integrated development of the circuit arrangement of the invention in accordance with FIG. 1, shown in section and partially broken away.

FIG. 3 shows another embodiment of a monolithically integrated circuit arrangement according to the invention, in which the annular trough 4 also contains in a widened region a lateral n-channel MOSFET-auxiliary transistor T2, the source zone of which is again designated 7 and the drain zone of which being again designated 8 and its polysilicon gate being designated 10. The widened region of the guard ring 4 overlaps in this case with the body zone K of the adjoining outermost cell of the MOSFET power transistor T1. The source zone 7 is however in this case only partially embedded in said body zone K of the MOSFET power transistor T1. The weakly doped edge region 1a of said body zone K does not extend in this case up into the channel region of the MOSFET auxiliary transistor T2, which channel region lies below the polysilicon gate 10, but it terminates already in the region of the source zone 7. This has the result that the threshold voltage of the MOSFET auxiliary transistor T2 is only determined by the region 4 and the epitaxial layer 11. There can thus be realized for the MOSFET auxiliary transistor T2 a threshold voltage which is smaller or larger than the threshold voltage of the MOSFET power transistor T1.

In the case of the two embodiments of FIGS. 2 and 3, the capacitor designated C1 in FIG. 1 is realized in the manner that the polysilicon gate 10, which is part of the MOSFET auxiliary transistor T2, extends in the region of the guard ring 4, in a manner not shown in FIGS. 2 and 3, beyond the channel region of the MOSFET auxiliary transistor T2, for instance in a direction perpendicular to the plane of the drawing in FIGS. 2 and 3.

Figure 4:
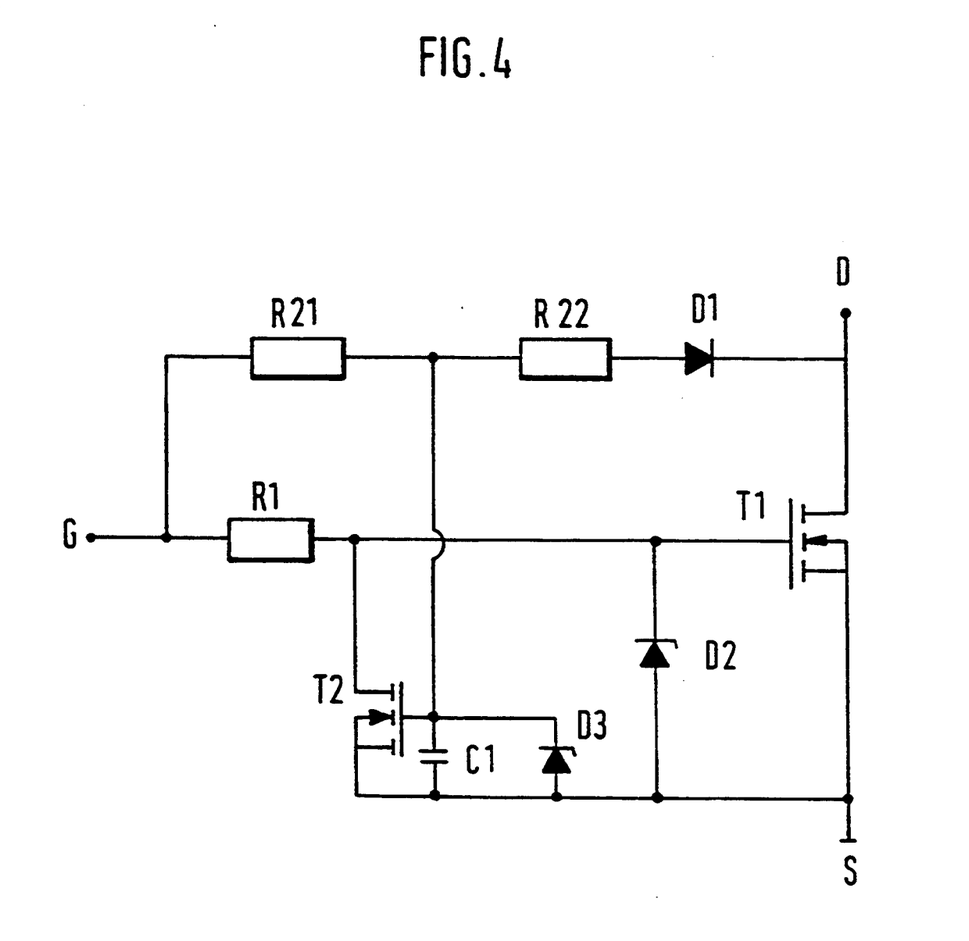
FIG. 4 shows a further development of the circuit arrangement according to FIG. 1.

FIG. 4 shows another circuit arrangement according to the invention. In addition to the circuit elements of FIG. 1, it shows a first Zener diode D2 for protecting the gate of the MOSFET power transistor T1 against overvoltages and a second Zener diode D3 for protecting the gate of the MOSFET auxiliary transistor T2 against overvoltages, the cathodes of the two Zener diodes D2, D3 being in each case connected to the gate to be protected and their anodes to the source electrode S of the MOSFET power transistor T1 which is connected to ground.

Figure 5:
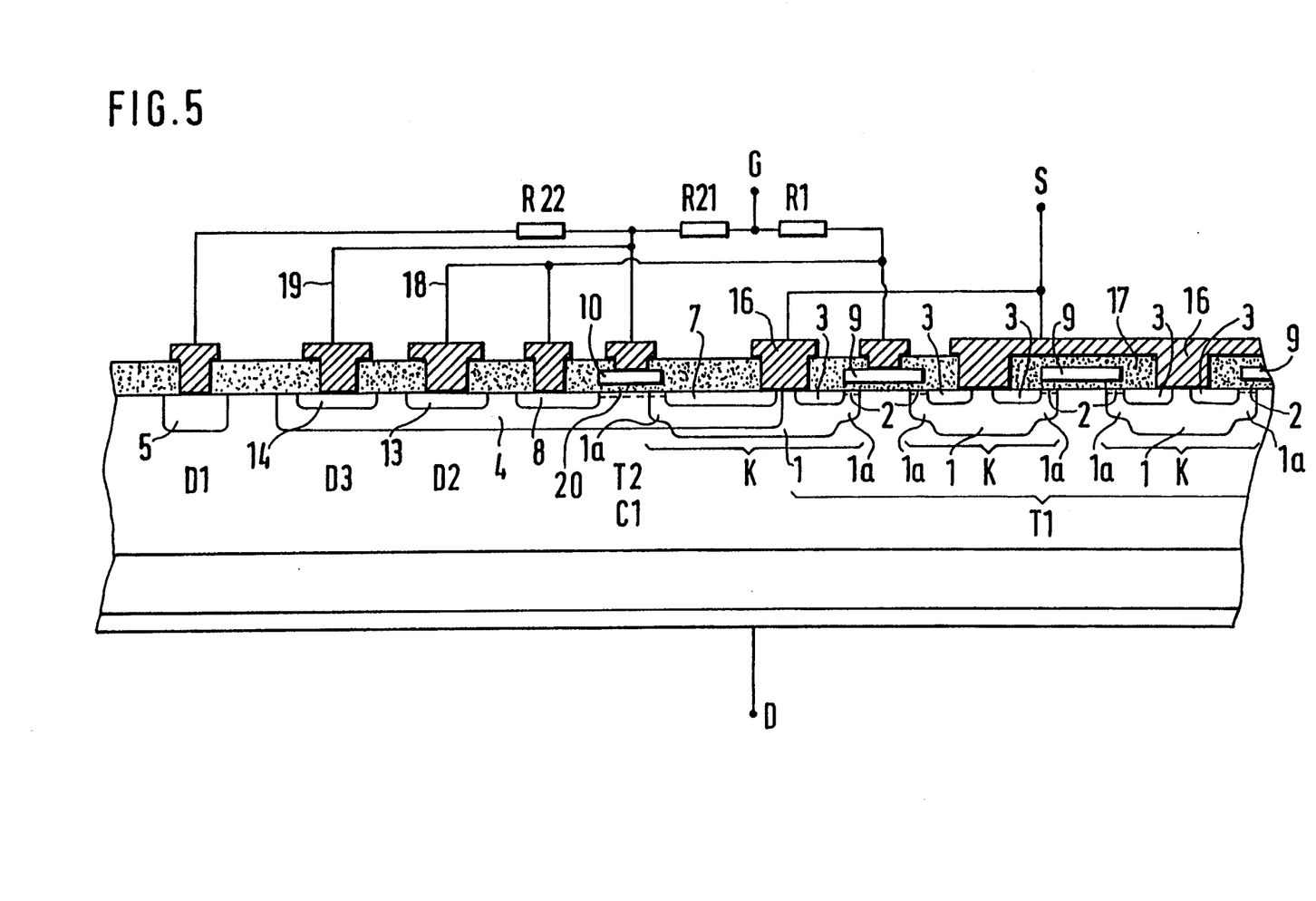
FIG. 5 shows a section through a monolithically integrated development of a circuit arrangement according to FIG. 4 as third embodiment of a monolithically integrated circuit arrangement according to the invention.

FIG. 5 shows how the two Zener diodes D2 and D3 are not monolithically integrated. The first Zener diode D2 is formed by an additional zone 13 having the conductivity type of the semiconductor body but increased impurity concentration, which is diffused into the guard ring 4, the zone 13 forming the cathode of the first Zener diode D2 and being connected via the connecting line indicated at 18 to the polysilicon gate 9 of the MOSFET power transistor T1. The second Zener diode D3 is formed by an additional zone 14 having the conductivity type of the semiconductor body but increased impurity concentration, which is diffused into the guard ring 4, the zone 14 forming the cathode of the second Zener diode D3 and being connected via the connecting line indicated at 19 to the polysilicon gate 10 of the MOSFET auxiliary transistor T2. The guard ring 4 forms the common anode for both Zener diodes D2, D3, the guard ring 4 being connected to ground via the common source metallization 16 of the MOSFET power transistor T1.

The invention is not restricted to the embodiments described with reference to the drawing. In particular, in addition to the circuit elements T2, D2, and D3, further peripheral circuit elements can be integrated into the guard ring 4, in particular the resistors R1, R21, and R22, it being possible to develop said resistors as n++-doped diffused resistors. As an alternative to this, said resistors can also consist of polysilicon, be arranged in the plane of the polysilicon gates 9 and 10 and be produced simultaneously with said gates.

It is also within the scope of the invention to develop the MOSFET power transistor T1 as so-called SENSE-FET, i.e., to provide some of its cells with a separate source connection which is not connected in electrically conductive manner to the common source metallization 16 of the remaining cells.

It is also possible to develop and to arrange printed conductors of the connection metallization and/or resistors in such a manner so that by targeted burning through them a balancing of the circuit is possible.

As compared with the known discrete circuit elements the special advantage of one monolithically integrated circuit arrangement is the fact that manufacturing variances affect the individual circuit elements of the integrated circuit in the same manner. Thus, an extensive tracking of the threshold voltages is achieved. Furthermore, the temperature coefficient of the RDS(on) and of the resistors R21 and R22 is utilized in the manner that the overload detection at high chip temperature takes place earlier than at low chip temperature. This results in a protection of the circuit against excessively high operating temperatures.

Differing from the embodiments described with reference to the drawing, all semiconductor regions can also be of the opposite type of conductivity, i.e., n-conductive and p-conductive regions can be interchanged. In this way, a short-circuit-poof p-channel MOSFET power transistor according to the invention can be realized.

We claim:

1. A monolithically integrated circuit comprising:

a disc-shaped monocrystalline semiconductor body of silicon having a first conductivity type and having a first and second main surface;

said semiconductor body having a vertical MOSFET-power transistor, said power transistor having a first drain zone extending from the first to the second main surface, a drain connection on the second main surface, at least one body zone of a second conductivity type, opposite the first conductivity type, extending from the first main surface, into the semiconductor body, at least a first source zone, of the first conductivity type, with increased impurity concentration, extending from the first main surface into the at least one body zone, at least one polysilicon gate for the formation of a conductivity channel, and a guard ring surrounding the power transistor, said guard ring having the second conductivity type;

at least one further zone disposed inside the guard ring and extending from the first main surface to form at least one peripheral circuit element, said peripheral circuit element having at least one lateral MOSFET-auxiliary transistor, the guard ring providing a second body zone for the lateral MOSFET-auxiliary transistor, the MOSFET-auxiliary transistor having a second source zone and a second drain zone of the first conductivity type, said second source and second drain zones situated adjacent to each other in the guard ring, and a gate electrode of the MOSFET-auxiliary transistor extending over a region of the guard ring which lies between the second source zone and the second drain zone, thereby forming a conductivity channel for the MOSFET-auxiliary transistor on the first main surface of the semiconductor body.

2. A circuit according to claim 1 wherein the body zone of the MOSFET-power transistor is formed by diffusing, one into the other, a small-area zone and a large-area zone, the small-area zone having a higher and the large-area zone having a lower doping concentration than the guard ring, the large-area zone extending on all sides beyond the small-area zone.

3. A circuit according to claim 2 wherein the MOSFET-power transistor includes a plurality of partial transistors connected in parallel, each of which has a body zone and at least one source zone, the plurality of partial transistors sharing a common drain zone which is formed by a remaining region of the semiconductor body which is not occupied by the plurality of body zones and the guard ring.

4. A circuit according to claim 3 wherein the guard ring, in the region corresponding to the auxiliary transistor, overlaps the body zone of an adjoining outermost cell of the MOSFET-power transistor.

5. A circuit according to claim 4 wherein the second source zone of the MOSFET-auxiliary transistor is completely embedded in the body zone of the adjoining outermost cell of the MOSFET-power transistor and wherein the second drain zone of the MOSFET-auxiliary transistor is located in the region outside said body zone so that the large area zone of said body zone of the MOSFET-power transistor extends into the conductivity channel of the MOSFET-auxiliary transistor.

6. A circuit according to claim 4 wherein the second source zone of the MOSFET-auxiliary transistor is partially embedded in the body zone of the adjoining outermost cell of the MOSFET-power transistor, which body zone overlaps with the guard ring.

7. A circuit according to claim 5 wherein the second source zone of the MOSFET-auxiliary transistor is short circuited with the first source zone of the adjoining outermost cell of the MOSFET-power transistor and with the guard ring by means of a source metallization of the MOSFET-power transistor.

8. A circuit according to claim 7 further comprising a protective diode;
and wherein,
- a drain electrode of the MOSFET-auxiliary transistor is connected directly to a gate electrode of the MOSFET-power transistor (T1) and, via a first ohmic resistor, to a gate input terminal of the MOSFET-power transistor;
- a gate electrode of the MOSFET-auxiliary transistor is connected, via a second ohmic resistor, to said gate input terminal and further connected, via the protective diode, to a drain electrode of the MOSFET-power transistor,
- a first electrode of the protective diode is formed by the disc-shaped semiconductor body and a second electrode of the protective diode is formed by a first additional zone extending from the first main surface into the semiconductor body and having a conductivity type opposite that of the semiconductor body.

9. A circuit according to claim 8 wherein the fist additional zone forming the second electrode of the protective diode has the same doping as the guard ring.

10. A circuit according to claim 8 further comprising a first Zener diode for protecting the gate of the MOSFET-power transistor against overvoltages, the first Zener diode residing in a second additional zone in the guard ring, said second additional zone having the conductivity type of the semiconductor body, with increased impurity concentration, the second additional zone forming a first electrode of the first zener diode and the guard ring forming a second electrode of the first Zener diode, the second additional zone connected to the gate of the MOSFET-power transistor.

11. A circuit according to claim 10 further comprising a second Zener diode for protecting the gate of the MOSFET-auxiliary transistor against overvoltages, the second Zener diode residing in a third additional zone in the guard ring, said third additional zone having the conductivity type of the semiconductor body, with increased impurity concentration, the third additional zone forming a first electrode of the second Zener diode and the guard ring forming a second electrode of the second Zener diode, the third additional zone connected to the gate of the MOSFET-auxiliary transistor.

12. A circuit according to claim 3 wherein the MOSFET-power transistor is a SENSEFET-power transistor, and at least one of the partial transistors includes a separate source connection.

13. A circuit according to claim 8 wherein at least one of the first and second ohmic resistors is arranged as a diffused resistor in the guard ring, the diffused resistor having the conductivity type of the semiconductor body, with increased impurity concentration.

14. A circuit according to claims 8 wherein at least one of the first and second ohmic resistors includes polysilicon and is arranged in a plane of the polysilicon gate of the MOSFET-power transistor.

15. A circuit according to claim 1 further comprising at least one capacitor having a first polysilicon foil, arranged in a plane of the polysilicon gate of the MOSFET power transistor, and a second foil formed at least in part by the guard ring.

* * * * *

UNITED STATES PATENT AND TRADEMARK OFFICE
CERTIFICATE OF CORRECTION

PATENT NO. : 5,432,371
DATED : July 11, 1995
INVENTOR(S) : Denner, et. al.

It is certified that error appears in the above-indentified patent and that said Letters Patent is hereby corrected as shown below:

Column 6, line 65, "claim 3" should be --claim 2--.

Signed and Sealed this

Second Day of January, 1996

Attest:

BRUCE LEHMAN

Attesting Officer      Commissioner of Patents and Trademarks